United States Patent [19]

Suppelsa et al.

[11] Patent Number: 5,300,808
[45] Date of Patent: Apr. 5, 1994

[54] EPROM PACKAGE AND METHOD OF OPTICALLY ERASING

[75] Inventors: Anthony J. Suppelsa; Lynne J. Giacomino; Anthony B. Suppelsa; Dale W. Dorinski, all of Coral Springs, Fla.

[73] Assignee: Motorola, Inc., Schaumburg, Ill.

[21] Appl. No.: 878,122

[22] Filed: May 4, 1992

[51] Int. Cl.$^5$ ............................................. H01L 23/02
[52] U.S. Cl. ................................. 257/680; 257/681; 257/787; 359/43
[58] Field of Search .................... 257/680, 681, 787; 359/39, 83, 43, 37, 86, 40

[56] References Cited

U.S. PATENT DOCUMENTS

| | | | |
|---|---|---|---|
| 3,898,977 | 8/1975 | Draper | 359/43 |
| 4,126,758 | 11/1978 | Krumme | 257/704 |
| 4,641,156 | 2/1987 | Ohta et al. | 359/86 |
| 5,063,435 | 11/1991 | Okamoto et al. | 257/681 |
| 5,113,270 | 5/1992 | Fergason | 359/37 |

FOREIGN PATENT DOCUMENTS

| | | | |
|---|---|---|---|
| 58111352 | 12/1981 | Japan | 23/30 |
| 60-211962 | 4/1984 | Japan | 23/28 |
| 3-091945 | 4/1991 | Japan | . |

OTHER PUBLICATIONS

"Advanced Technology: PLZT Ceramics" by James R. Phillips, Information Display, Apr. 1989.

Primary Examiner—William Mintel
Assistant Examiner—Roy Potter
Attorney, Agent, or Firm—Dale W. Dorinski

[57] ABSTRACT

An erasable programmable read only memory (EPROM) package whose storage information can be erased by irradiating with light of a certain wavelength. A semiconductor device (34) with an erasable programmable read only memory is mounted on a circuit carrying substrate (30). Synthetic resin (37) covers the semiconductor device and portions of the circuit carrying substrate to provide a package. A window (39) is formed in the resin to expose the erasable-programmable-read-only-memory circuit to light. The window is cross-polarized and normally opaque to the light and transmits the light when appropriately energized to remove the cross polarization. The light is typically in the ultraviolet frequency, and the window may be made from a liquid crystal material or a solid crystal material such as PLZT. Applying a voltage to the window causes the liquid crystal material in the window to become transparent and allow the EPROM to be erased.

15 Claims, 6 Drawing Sheets

EPROM PACKAGE AND METHOD OF OPTICALLY ERASING

TECHNICAL FIELD

This invention relates generally to semiconductor packages, and most specifically to a package for an erasable programmable read only memory (EPROM) device.

BACKGROUND

Erasable-programmable-read-only-memory (hereinafter called EPROM) packages that can be erased by an ultra-violet (UV) light ray consist of an EPROM chip directly mounted on a printed circuit board having conductive interconnection patterns formed on the main surface of the board, or on a lead frame. Referring to FIG. 1, an example of a prior art plastic package, a printed circuit board 10 made of an insulating material, such as glass-filled epoxy resin, has a chip mounting portion 12 and conductive interconnection patterns 13 on a main surface thereof. The chip mounting portion 12 is one portion of the conductive interconnection patterns 13. One end of each of the patterns 13 is adjacent to the chip mounting portion 12 and another end of the patterns connects to individual terminals (not shown). An EPROM chip 14 is mounted on the chip mounting portion 12 by, for example, a conductive adhesive 15, in such a manner that the active surface 4 thereof faces upward. Each of the pad electrodes of the EPROM chip 14 may be connected to one end of each of the patterns 13 with thin metal wires 16. One of the pad electrodes of the EPROM chip 14 connects to the chip mounting portion 12 with a thin metal wire so as to make an ohmic contact with the substrate of the chip 14. Then, the combined portion comprising the thin metal wires 16, the EPROM chip 14, and portions of the conductive patterns 13 are encapsulated by a cap or cover 17. The cap 17 is typically made from an UV opaque material, such as ceramic or black plastic, and contains a window 19 capable of transmitting UV light. The cap 17 is securely fixed to the board 10 with an adhesive 18 such as epoxy. In order to prevent the EPROM 14 from becoming accidentally erased, an opaque, light tight covering 5 is typically placed over the window 19. The covering 5 takes many forms, such as permanent coatings, temporary coatings, adhesive tape dots, removable plugs, removable caps, additional housings for the package, or conformal coatings. Each of these requires that the covering 5 be physically removed whenever the user desires to erase the information contained in the EPROM 14, and then replaced or reassembled prior to reprogramming the EPROM.

Another example of an EPROM package, a dual-inline package (hereinafter simply called a DIP package), is illustrated in FIG. 2. The EPROM package includes an EPROM chip 24, a lead frame 21, leads 23, and a cap, cover, or housing 27 formed from alumina ceramic ($Al_2O_3$) or plastic resin. The EPROM chip 24 is bonded or mounted on a chip mounting portion 22 of the lead frame 21, and contains electrode pads which are connected to the lead frame with thin metal wires 26, such as gold or aluminum. A window 29 through which UV light may pass to the EPROM chip 24 is contained in the center of the cap 27. In order to prevent the EPROM 24 from becoming accidentally erased, an opaque, light tight covering 25 is typically placed over the window 29. The covering 25 takes many forms, as described above. The covering 25 must be physically removed whenever the user desires to erase the information contained in the EPROM, and then replaced on the DIP prior to reprogramming the chip.

DIP packages and other conventional EPROM packages suffer from the disadvantage of having to continually remove the window covering 25 when erasing the programmed information, and then replacing the covering 25 to prevent accidental erasure of the chip by stray light. It would be a significant advantage if one were able to erase the chip without having to physically remove the covering 25 and replace it each time.

SUMMARY OF THE INVENTION

Briefly, according to the invention, there is provided an erasable programmable read only memory (EPROM) package whose storage information can be erased by irradiating with light of a certain wavelength. A semiconductor device having an erasable-programmable-read-only-memory circuit is contained within an enclosure means. The enclosure means has a window that is normally opaque to light but switchable to pass light to the erasable-programmable-read-only-memory circuit.

In an alternate embodiment, a semiconductor device with an erasable programmable read only memory is mounted on a circuit carrying substrate. Synthetic resin covers the semiconductor device and portions of the circuit carrying substrate to provide a package. A window is formed in the resin to expose the erasable-programmable-read-only-memory circuit to light. The window is normally opaque to the light and transmits the light when appropriately energized.

In another embodiment, an EPROM package has a circuit carrying substrate having conductive portions and an EPROM chip having an optically erasable surface. The chip is electrically and mechanically attached to the substrate and a material is molded on portions of the substrate and encapsulates the EPROM chip while providing an optical path to the erasable surface. The optical path comprises a cross-polarized window that is normally opaque to light of a certain frequency but transparent to the light when appropriately energized. The light is typically ultraviolet light, and the window may be made from a liquid or solid crystal material. Applying a voltage to the window causes the crystal material in the window to become transparent and allow the EPROM to be erased.

A method of erasing a programmable-read-only-memory device is provided in a further embodiment. The programmable-read-only-memory device has a window, and is erased by appropriately energizing the window to render it at least partially transparent to light of a certain wavelength, exposing the device to the light, and de-energizing the window to render it substantially opaque to the light.

DETAILED DESCRIPTION OF THE PREFERRED EMBODIMENT

Figure 1:
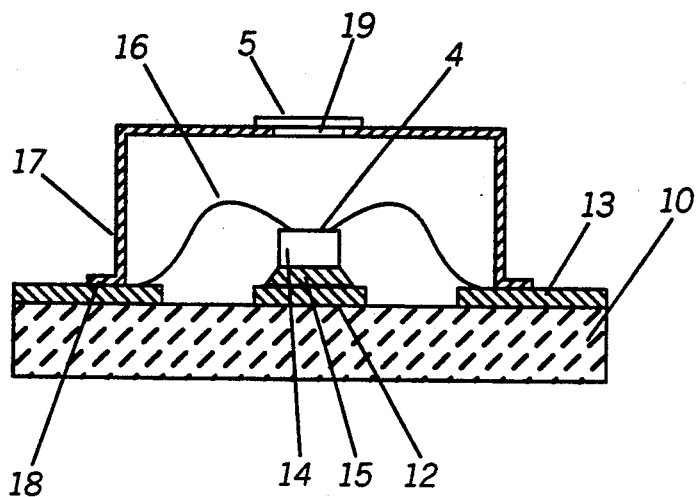
FIG. 1 is a cross-sectional view of an EPROM package in accordance with the prior art.
Figure 2:
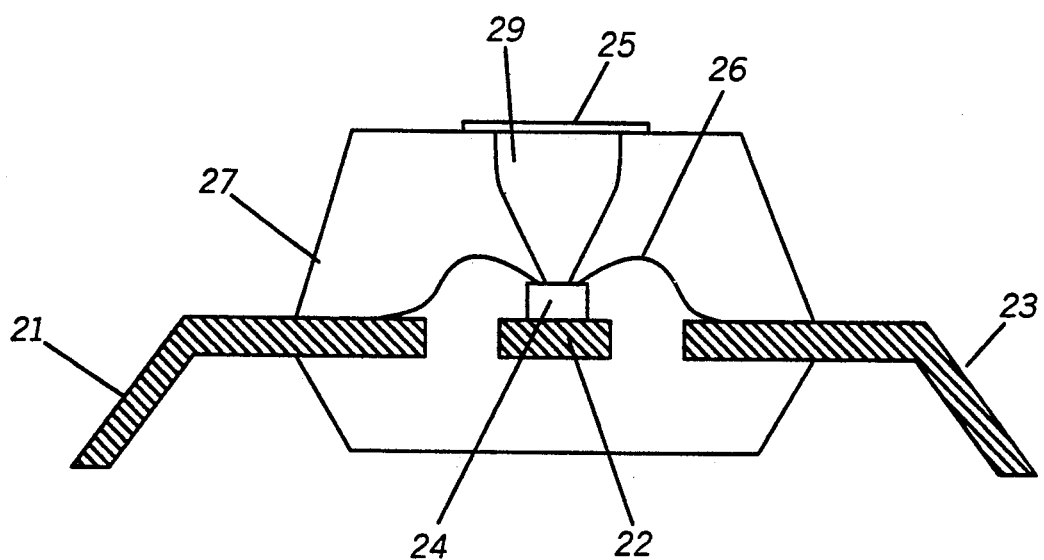
FIG. 2 is a cross-sectional view of a DIP EPROM package in accordance with the prior art.
Figure 3:
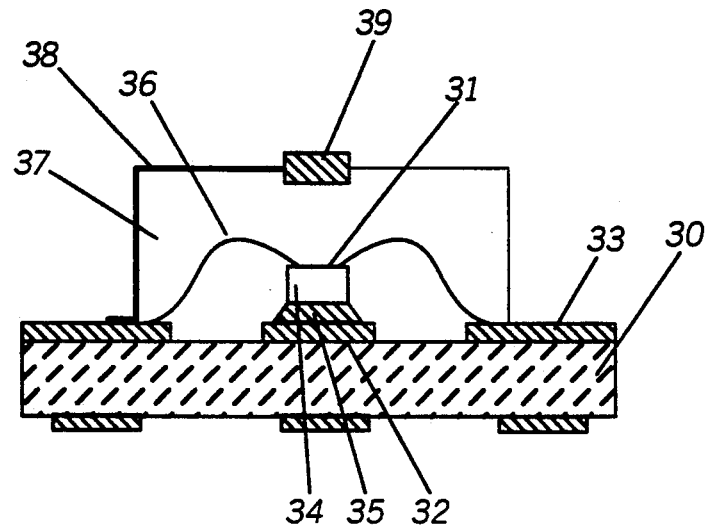
FIG. 3 is a cross-sectional view illustrating an embodiment of an EPROM package in accordance with the invention.

A constructional example of the invention will now be described with reference to the accompanying drawing figures, in particular now FIG. 3, where a printed circuit board or flexible circuit 30 made of insulating material, such as epoxy, polyimide, polytetrafluoroethylene, polyetherimide, polyethylene, or polyester resin, or alumina ceramic, has a chip mounting portion 32 and conductive interconnection patterns 33 on the main surface thereof. The printed circuit board 30 may also be reinforced with glass fibers. The chip mounting portion 32 is defined as one portion of the conductive interconnection patterns 33. One end of each of the patterns 33 is adjacent to the chip mounting portion 32 and another end of the patterns 33 is connected to respective connector terminals (not shown). An EPROM chip 34 is mounted on the chip mounting portion 32 by, for example, a conductive adhesive 35, in such a manner that the active surface 31 thereof faces upward. Each of the pad electrodes of the EPROM chip 34 is connected to one end of each of the patterns 33 with thin metal wires 36 of gold or aluminum. The combined portion comprising the thin metal wires 36 and the EPROM chip 34, is encapsulated by transfer molding a cover 37 about that portion. Materials such as epoxies, polyesters, polyetherimides, acrylics, ally diglycol carbonates, cellulose acetate butyrate, phenolics, polyphenylene oxide, polyphenylene sulfide, polyphenyl sulfone, polyaryl sulfones, polyarylates, polycarbonates, epoxy transfer molding compound, and polyvinyl chloride may be used. Both thermoset and thermoplastic materials may be utilized, and candidate materials are well known to those skilled in the art. Alternatively, the cover 37 may be a hollow cap or lid that accomplishes the same purpose, but does not encapsulate the chip. The cover 37 may be plastic, metal, or alumina ceramic. In order to provide programmability, an opening or window 39 is provided in the cover 37. The aperture for the window is typically formed during the molding operation, but in the case where a hollow cover is simply placed over the chip, the aperture is typically provided prior to attachment to the substrate.

Figure 6:
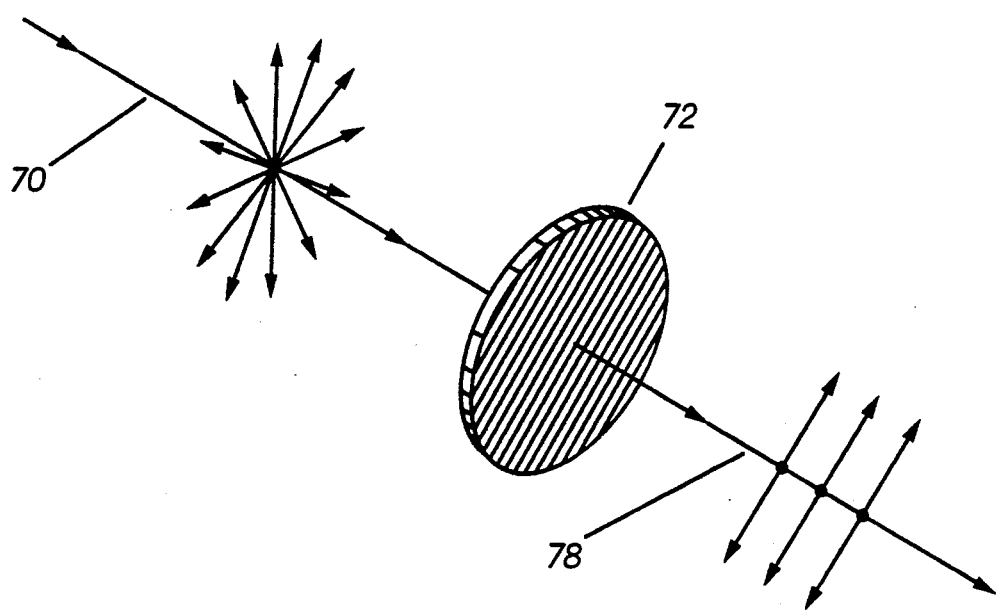
FIG. 6 is a schematic view of the light polarization process.

A detailed description of the window construction will now be provided. FIG. 6 shows unpolarized light 70 falling on a sheet of polarizing material 72. There exists in the sheet 72 a certain characteristic polarizing direction, shown by the parallel lines. The sheet 72 will transmit only those wave train components of the light 70 whose electric vectors vibrate parallel to this direction and will absorb those what vibrate at right angles to this direction. The light 78 emerging from the polarizing sheet 72 will be plane polarized. The polarizing direction of the sheet 72 is established, for example, during the manufacturing operation by embedding certain long chain molecules in a flexible plastic sheet and then stretching the sheet so that the molecules are aligned parallel to each other. The technique of producing polarized sheets or films is well known to those skilled in the art.

Figure 7:
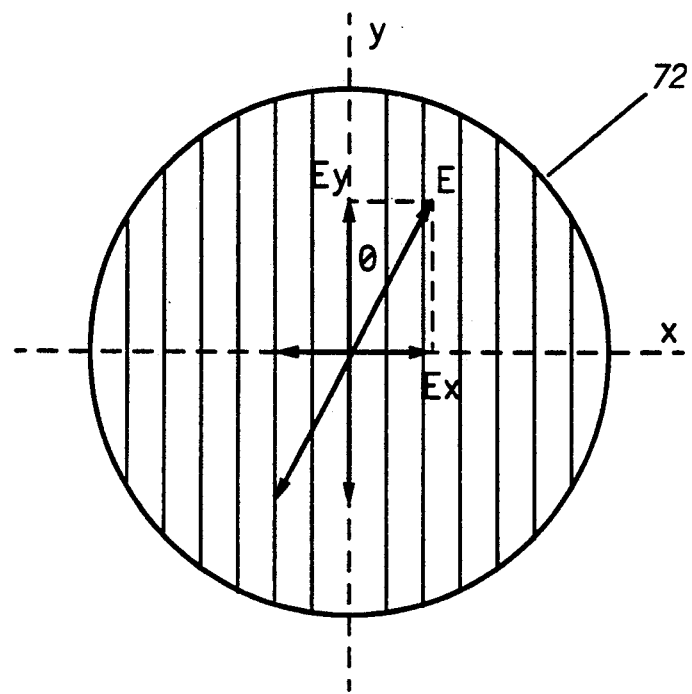
FIG. 7 is a graph showing the vector magnitude of a typical light wavetrain component.

In FIG. 7 the polarizing sheet or polarizer 72 lies in the plane of the page and the direction of propagation is into the page. The arrow E shows the plane of vibration of a randomly selected light wavetrain falling on the sheet 72. Two vector components, $E_y$ (of magnitude E sinq) and $E_x$ (of magnitude E cosq), can replace E, one parallel to the polarizing direction and one at right angles to it. Only the former will be transmitted, while the other is absorbed within the sheet 72.

Figure 8:
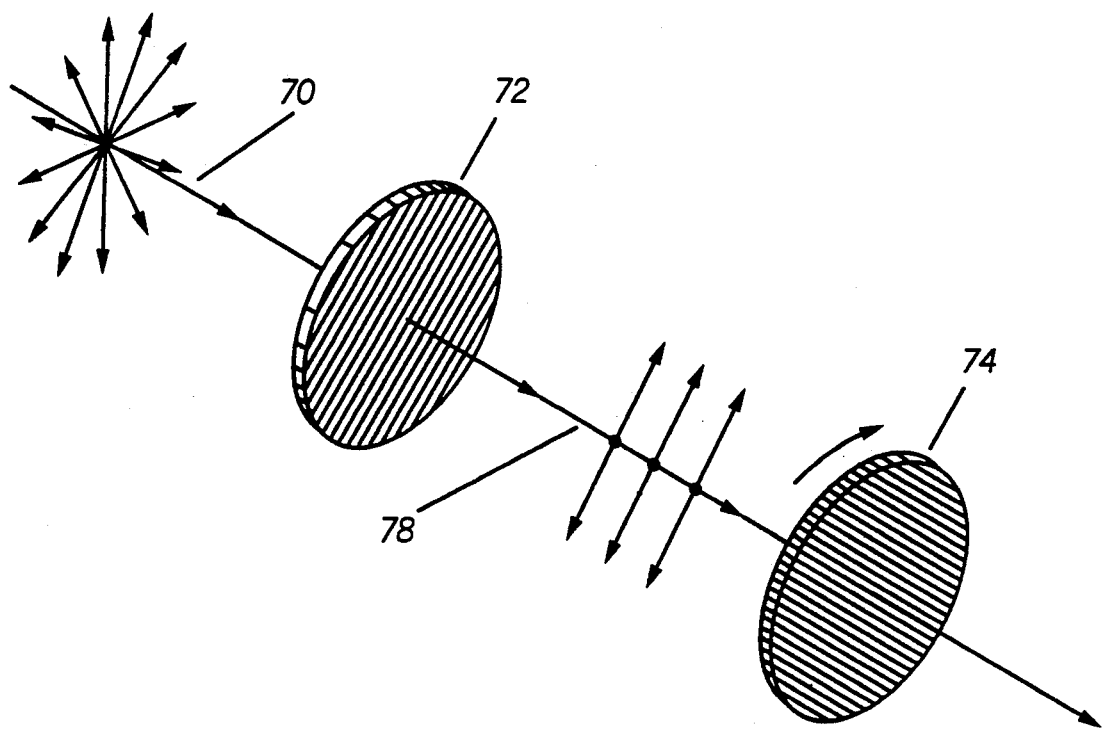
FIG. 8 is a schematic view showing the phenomena of cross-polarization.

Referring now to FIG. 8, a second polarizing member 74 (also referred to as an analyzer), is placed so that the light ray 78 emitted from the first polarizer 72 passes directly through the analyzer. If the analyzer 74 is rotated about the direction of propagation, there are two positions, 180° apart, at which the transmitted light intensity is almost zero. These are the positions in which the polarizing direction of the two polarizing members 72 and 74 are at right angles or "cross-polarized". If the amplitude of the plane-polarized light falling on the analyzer is $E_m$, the amplitude of the light that emerges is $E_m \cos 1$, where q is the angle between the polarizing directions of the first polarizer and the analyzer. The transmitted intensity therefore varies according to $$I = I_m \cos^2 q,$$

where $I_m$ is the maximum value of the transmitted intensity. By rotating the two polarizing members 72 and 74 so that planes of polarization are approximately parallel, the amount of light transmitted is maximized, as the wave train components of the light pass uniformly through the polarizing members. Other positions between these extremes produce light transmission of varying degrees.

Placing the two polarizing members described above in an aperture of the EPROM housing 37 now provides control over the amount of light transmitted through the window 39. By controlling the degree of cross-polarization, the amount of light passing through the window 39 can be regulated, from full transmission to minimal transmission. Thus, if the two polarizing members are cross-polarized, the EPROM chip 34 will be fully shielded from erasure. By orienting the polarizing fields so that they are not cross-polarized, varying degrees of light can be admitted to the surface of the chip 34, thereby erasing the EPROM when desired.

The window 39 can also be created using PLZT technology. PLZT is a modification of piezoelectric ceramic PZT (lead zirconate titanate), which is used in speakers and ultrasonic transducers. PZT is polycrystalline and ferroelectric. When it is exposed to an electric field, the atoms in the crystal lattice realign themselves to create a permanent electrical polarization. Modification of the PZT chemistry with lanthanum replacing some of the lead atoms results in a new structure called PLZT (lanthanum-modified lead zirconate titanate).

This structure also responds to an electric field, but at proper concentrations of lanthanum, the realignment is reversible, not permanent. In the relaxed state, when no field is present, the index of refraction is isotropic, that is, identical along all crystal axes. Under the influence of an electric field, the material strains and becomes anisotropic. This means that the index of refraction along the crystal axis perpendicular to the field increases with the field's magnitude, while the refractive index parallel to the field doesn't change.

Figure 9:
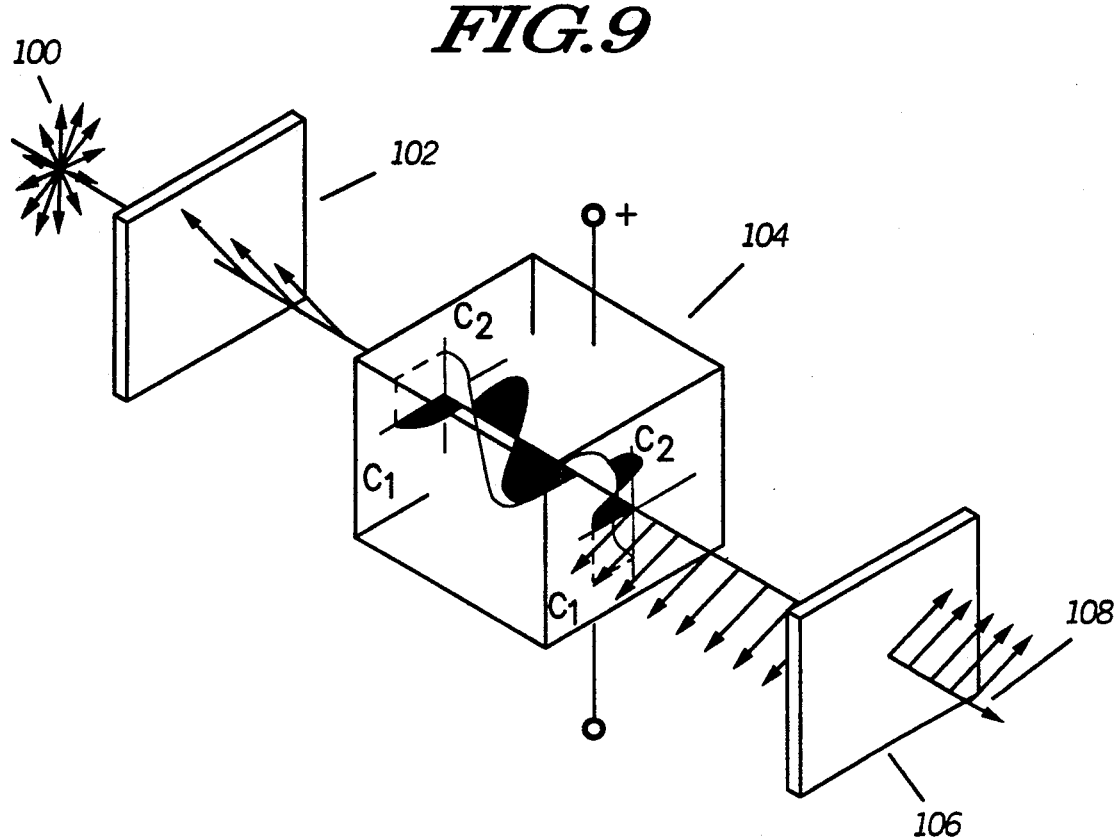
FIG. 9 is a schematic view of a window made with a PLZT crystal.

Most PLZT displays and shutters are based on the Kerr cell. Referring now to FIG. 9, light 100 passes through a polarizer 102 whose axis of polarization is aligned at an angle of 45° to the electric field that will be imposed on the PLZT ceramic element 104. At a first surface of the PLZT element, the light vector is split into two rays. One ray is polarized parallel to the electric field and is called the ordinary axis. The other ray is polarized perpendicular to the electric field and is called the extraordinary axis. With no field applied to the crystal 104, both the ordinary and the extraordinary components see the same index of refraction. As the two light rays exit the PLZT element, they are recombined at the same polarization angle. A second polarizer 106, called an analyzer, controls the amount of light 108 transmitted. If this second polarizer 106 is aligned parallel to the first 102, the PLZT element 104 has no effect on the amount of transmitted light. Increasing the electric field applied to the PLZT element causes the crystal to strain and become anisotropic. The ordinary-axis ray is unaffected but the index of refraction for the extraordinary axis-ray increases. This causes the light ray propagating along the extraordinary axis to be slowed, or retarded, resulting in an optical phase shift between the two components. When the two components recombine as they exit the crystal, the polarization angle is rotated with respect to that of the incoming ray, and the amount of light transmitted by the analyzer is reduced just as if the analyzer had itself been rotated with respect to the polarizer. This phenomenon allows one to control the amount of light passing through the window by varying the voltage. The reduction also varies with wavelength, and the reduction is temperature dependent.

Figure 10:
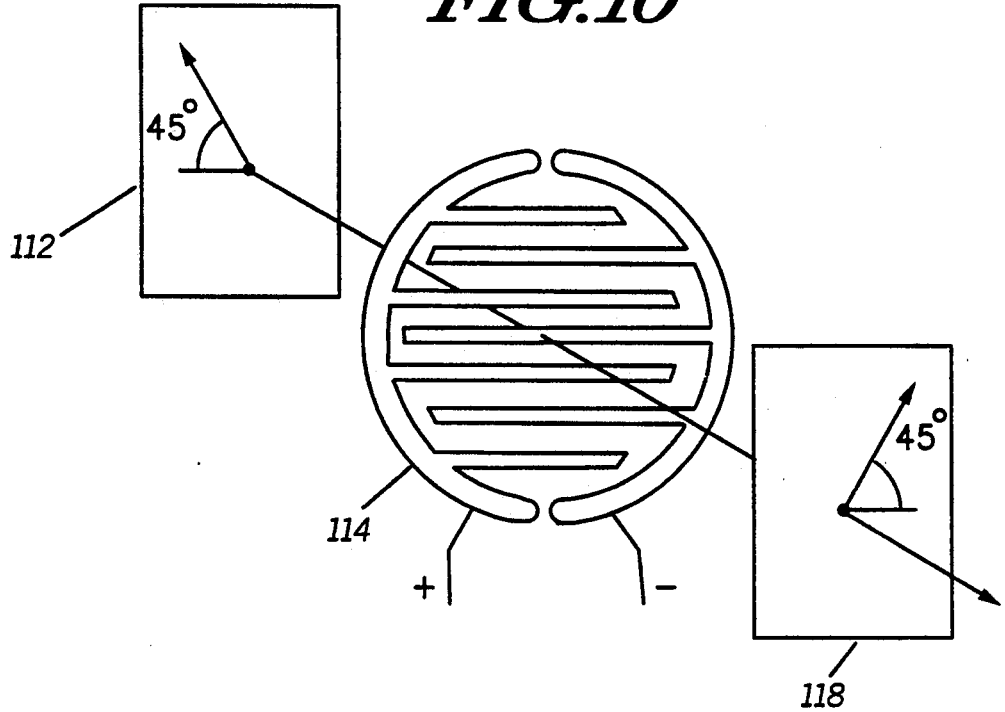
FIG. 10 is an alternate embodiment of a window made with a PLZT ceramic crystal in accordance with the invention.

FIG. 10 shows an alternate means of creating the window 39, where an interdigitated electrode 114 is formed on the PLZT crystal and the field is applied across the surface of the ceramic. A polarizer 112 and analyzer 118 are employed on both sides of the PLZT as in previous examples. The EPROM window 39 is then made by creating an appropriate structure at the aperture of the EPROM package body. The field of the PLZT element is connected to appropriate pins of the package. When the EPROM is soldered into the circuit board or substrate, the window is activated by energizing the PLZT crystal field through the PCB circuit. In this way, an EPROM can be automatically erased by, for example, a test station that incorporates a means for energizing the field and then flooding the window with light. When the field is reversed, the window becomes dark, greatly reducing the amount of light that reaches the semiconductor device 34.

Figure 11:
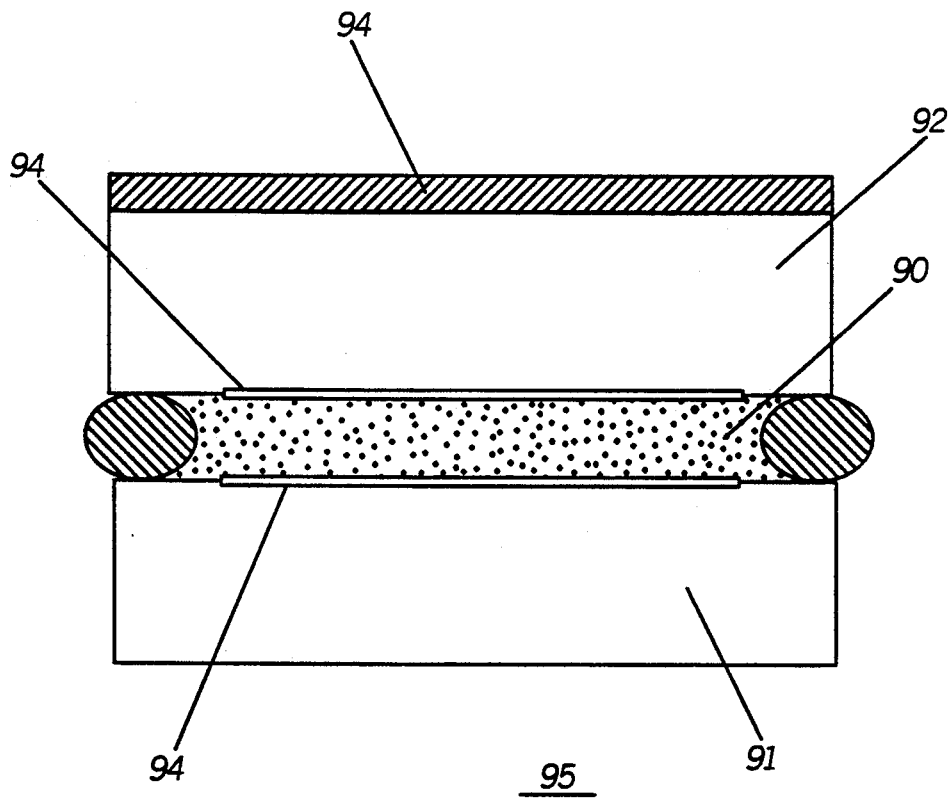
FIG. 11 is a further embodiment of a window made with a liquid crystal cell in accordance with the invention.

In another embodiment of the invention, an electrically operable window can be created in a manner similar to the PLZT described above, but a liquid crystal device (LCD) can be substituted for the solid crystal PLZT. A typical LCD, used in the transmissive mode, is formed as shown in FIG. 11, where the liquid crystal material 90 is disposed between two glass plates 91 and 92. A conductive, transparent layer 96 of indium-tin oxide is typically formed on a surface of both of the plates, and is used to energize the liquid crystal material 90 and cause it to be polarized. A fixed polarizing member 94 is placed over the upper glass plate. When the LCD material is energized, it becomes polarized in a direction perpendicular to the direction of the fixed polarizer 94, causing the display to become black or opaque. The complete structure 95 then serves as the window material, and is placed in the aperture of the cover just as in the previous examples. By electrically connecting the LCD structure 95 to appropriate parts of the larger circuit, the window can be selectively activated and deactivated to cause it to change state from transparent to opaque when desired. Depending on the arrangement of the liquid crystal material and the polarizer, the window can be made either to be transparent when energized, or opaque when energized.

Figure 4:
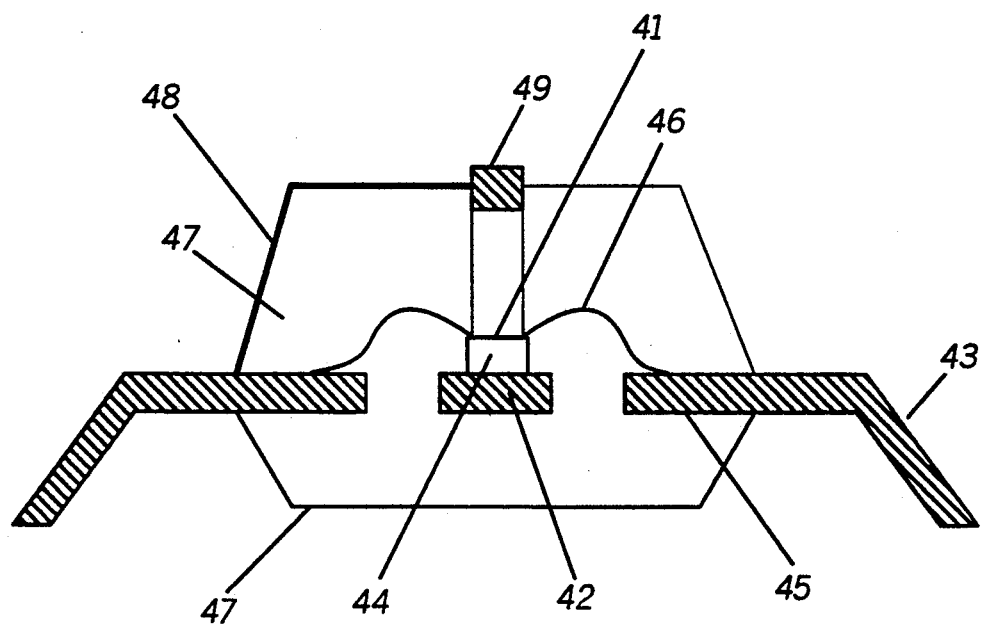
FIG. 4 is a cross-sectional view illustrating another embodiment of an EPROM package in accordance with the invention.

In another embodiment of the invention, FIG. 4, the EPROM package is formed about a metal lead frame 43 containing a chip mounting portion 42 and a plurality of terminal portions 45. In the case of EPROM chips that are TAB bonded directly to the lead frame, the chip mounting portion 42 is not present in the lead frame. Each terminal portion 45 terminates in an area adjacent to the chip mounting portion 42, providing sites for electrical connection of the electrode pads of the chip 44 to the leads 43. The formation and layout of metal lead frames is well known to those skilled in the art. An EPROM chip 44 having an UV erasable active surface 41 is bonded or mounted on the chip mounting portion 42 of the lead frame 43. After wire-bonding with thin metal wires 46, such as gold or aluminum, between the chip 44 and the leads 43, the package is formed by encasing the lead frame assembly and the chip in a body 47 to form a package. The design of the package is such as to allow the legs of the lead frame to extend beyond the body of the package, thereby forming a dual-in-line package. This design allows light external to the package to impinge on the UV erasable surface 41 as it passes through the operable window 49.

Figure 5:
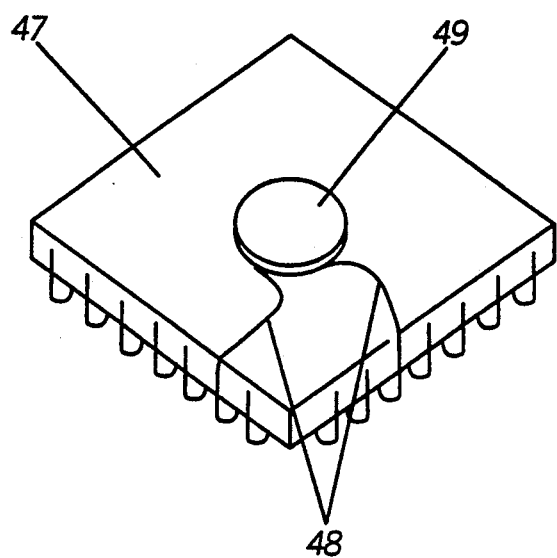
FIG. 5 is a plan view of an embodiment of EPROM packages in accordance with the invention.

Another configuration is shown in FIG. 5, such as folding the legs under the package to form a plastic leaded chip carrier (PLCC). The chip may be directly bonded to the lead frame to form a flat package, or a pad array chip carrier may also be formed, and still be within the spirit and scope of the invention.

Still other embodiments of the invention can be envisioned by one skilled in the art, for example, the chip or die may be mounted face down on a substrate, using TAB bonding or C4 technology. In this case, the substrate or lead frame has an opening directly below the chip so as to allow the active surface to be erased. The operable window is then mounted on the bottom of the package. This scheme would be useful, for example, in credit card package applications, where either side of the substrate could be selected to be exposed to the erasing light.

Accordingly, this invention provides improved ease of handling the chip, while allowing the surface of the EPROM chip to be erased by UV light without removing a cover. The need to provide a separate window covering, as in the packages of prior art designs, is obviated, thus reducing the complexity and cost of the package.

What is claimed is:

1. An EPROM package comprising:

a circuit carrying substrate having conductive portions;

an EPROM chip having an optically erasable surface, said chip being electrically and mechanically attached to said circuit carrying substrate; and a cover formed on portions of said circuit carrying substrate and encapsulating said EPROM chip, said cover providing an optical path to said erasable surface, said optical path comprising a fixed PLZT window sealing said EPROM package that is normally opaque to ultraviolet light but transmits said light when appropriately energized.

2. The EPROM package of claim 1, wherein the window is cross-polarized in the normal state, and parallel polarized in the energized state.

3. The EPROM package of claim 1, wherein the window is substantially transparent to ultraviolet light of about 254 nanometer wavelength when energized.

4. The EPROM package of claim 1, wherein the circuit carrying substrate comprises a glass fiber reinforced rigid member.

5. The EPROM package of claim 4, wherein the circuit carrying substrate comprises a material selected from the group consisting of epoxy, polyimide, polyester, polyetherimide, polyethylene, ceramic, and polytetrafluoroethylene.

6. The EPROM package of claim 1, wherein the circuit carrying substrate is a metal lead frame.

7. The EPROM package of claim 1, wherein the circuit carrying substrate comprises a flexible member.

8. A method of erasing a programmable-read-only-memory device having a cross-polarized PLZT window, comprising temporarily removing the cross-polarization by appropriately energizing the PLZT window to render it at least partially transparent to light of a certain wavelength thereby exposing an active surface of the device to the light, and de-energizing the PLZT window to render it substantially opaque to the light.

9. The method as described in claim 8, wherein the window is energized by applying a voltage to the PLZT window and causing it to become transparent.

10. The method as described in claim 9, wherein the PLZT window remains transparent when the voltage is removed.

11. The method as described in claim 8, further comprising a step of applying voltage of an opposite polarity to the PLZT window, thereby causing the PLZT window to revert to the cross-polarized state.

12. The method as described in claim 11, wherein the PLZT window remains cross-polarized when the voltage is removed.

13. The method as described in claim 8, wherein the PLZT window is cross-polarized in the normal state, and parallel polarized in the energized state.

14. An EPROM package comprising:

a printed circuit having a chip mounting portion and conductive interconnecting patterns thereon, the interconnecting patterns including pads adjacent to the chip mounting portion;

an EPROM chip mounted on the chip mounting portion and electrically connected to the pads;

resin molded about the EPROM chip and covering portions of the printed circuit; and an opening formed in the molded resin so as to expose an optically erasable surface of the EPROM chip, the opening being sealed by a cross-polarized PLZT window that is normally opaque to ultraviolet light, the window becoming transparent to ultraviolet light when appropriately energized to remove the cross-polarization.

15. An EPROM package comprising:

a circuit carrying substrate having conductive portions;

an EPROM chip having an optically erasable surface, said chip being electrically and mechanically attached to said circuit carrying substrate; and a cover formed on portions of said circuit carrying substrate and encapsulating said EPROM chip, said cover providing a sealed window to said erasable surface, said sealed window comprising:

two polarizers superimposed upon each other, at least one polarizer mounted so as to be rotatable about a central axis, making said window normally opaque to ultraviolet light when said at least one polarizer is in a first position and transparent to ultraviolet light when rotated to a second position.

* * * * *